United States Patent
Kang et al.

[11] Patent Number: 6,140,704
[45] Date of Patent: Oct. 31, 2000

[54] INTEGRATED CIRCUIT MEMORY DEVICES WITH IMPROVED TWISTED BIT-LINE STRUCTURES

[75] Inventors: Sang-seok Kang; Jong-hyoung Lim, both of Kyungki-do, Rep. of Korea

[73] Assignee: Samsung Electronics Co., Ltd., Rep. of Korea

[21] Appl. No.: 09/296,930

[22] Filed: Apr. 22, 1999

[30] Foreign Application Priority Data

May 12, 1998 [KR] Rep. of Korea ........................ 98-16966

[51] Int. Cl.[7] ............................ H01L 23/48; H01L 23/52; H01L 29/40
[52] U.S. Cl. .............................. 257/773; 257/776; 365/69
[58] Field of Search ..................................... 257/773, 776, 257/300, 296, 202; 365/69, 206, 149

[56] References Cited

U.S. PATENT DOCUMENTS

| | | |
|---|---|---|
| 4,922,459 | 5/1990 | Hidaka . |
| 5,062,077 | 10/1991 | Takashima et al. . |
| 5,144,583 | 9/1992 | Oowaki et al. ........................ 365/206 |
| 5,305,252 | 4/1994 | Saeki ......................................... 365/63 |
| 5,475,643 | 12/1995 | Ohta . |
| 5,602,773 | 2/1997 | Campbell . |
| 5,610,871 | 3/1997 | Hidaka ............................... 365/230.03 |
| 5,625,234 | 4/1997 | Suzzuki et al. . |
| 5,949,698 | 2/1999 | Shirley . |

*Primary Examiner*—Sheila V. Clark
*Attorney, Agent, or Firm*—Myers Bigel Sibley & Sajovec

[57] ABSTRACT

An integrated circuit memory device includes a memory cell array and first and second sense amplifiers positioned on respective opposite first and second sides of the memory cell array. A first bit line pair and a second bit line pair connect the memory cell array to the first and second sense amplifiers, respectively. A first bit line of the first bit line pair and a first bit line of the second bit line pair extend across the memory cell array from the first side to the second side without crossing one another. A second bit line of the second bit line pair extends across the memory cell array from the first side to the second side, crossing the first bit line of the first bit line pair and the first bit line of the second bit line pair.

18 Claims, 4 Drawing Sheets

INTEGRATED CIRCUIT MEMORY DEVICES WITH IMPROVED TWISTED BIT-LINE STRUCTURES

FIELD OF THE INVENTION

The present invention relates to integrated circuit memory devices, and more particularly, to twisted bit line memory devices.

BACKGROUND OF THE INVENTION

The trend towards the development of ever more highly integrated, large capacity integrated circuit memory devices has generally led to a reduction of the spacing between adjacent bit lines in such devices. This reduction in spacing can cause increased coupling capacitance between adjacent bit-lines, and thus can increase crosstalk.

FIG. 1 is a circuit diagram illustrating a twisted bit-line structure for a conventional memory device. A memory block 100 includes a plurality of sense amplifiers 121–126, a plurality of bit-line pairs (BL0, $\overline{BL0}$)–(BL5, $\overline{BL5}$), a plurality of wordlines WL0–WLn, and a memory cell array 141 including a plurality of memory cells M. The sense amplifiers 121–126 are positioned on both sides of the memory cell array 141. The bit-line pairs (BL0, $\overline{BL0}$)–(BL5, $\overline{BL5}$) are connected to respective ones of the sense amplifiers 121–126. Each bit line pair (BL0, $\overline{BL0}$)–(BL5, $\overline{BL5}$) includes a complementary set of bit lines, with each pair twisted near a central portion of the array 141. The wordlines WL0–WLn cross the bit-line pairs (BL0, $\overline{BL0}$)–(BL5, $\overline{BL5}$) at right angles, and are insulated therefrom. The memory cells M are formed at selected locations at which wordlines WL0–WLn and bit-lines (BL0, $\overline{BL0}$)–(BL5, $\overline{BL5}$) cross.

When a cell 101 is selected, coupling capacitance affecting the cell 101 includes coupling capacitance associated with a bit line BL2 connected to the cell 101 and coupling capacitance associated with a complementary bit line $\overline{BL2}$ connected to the cell 101. The coupling capacitances of the complementary bit line $\overline{BL2}$ present when the cell 101 is sensed by the sense amplifier 123 include ½Cbb1 and ½Cbb2 due to the bit line BL2 of a cell 101, ½Cbb3 due to the bit line $\overline{BL1}$ of a cell 103, and ½Cbb4 due to the complementary bit line $\overline{BL3}$ 0 of a cell 105. The total coupling capacitance Cbbt of the bit line BL2 of the cell 101 may be expressed as:

$$Cbbt = \frac{1}{2}Cbb1 + \frac{1}{2}Cbb2 + \frac{1}{2}Cbb3 + \frac{1}{2}Cbb4. \quad (1)$$

Because the coupling capacitances Cbb1, Cbb2, Cbb3 and Cbb4 typically are each approximately equal to a nominal coupling capacitance Cbb, the total coupling capacitance Cbbt may be expressed as:

$$Cbbt = 2Cbb. \quad (2)$$

An alternative to the above-described structure is described in U.S. Pat. No. 5,144,583. This patent describes a memory architecture in which three bit lines are twisted together, with the twisted portions of the bit lines composed of different conductive materials than the straight portions. This architecture can provide improved coupling capacitance over other bit line structures. However, there is a continuing need for bit line structures that offer increased potential integration density without incurring unacceptable coupling capacitance between adjacent bit lines.

SUMMARY OF THE INVENTION

In light of the foregoing, it is an object of the present invention to provide memory devices that offer increased potential integration density while minimizing coupling capacitance between adjacent bit lines.

This and other objects, features and advantages are provided according to the present invention by memory devices in which a first bit line of a first bit line pair and a first bit line of a second bit line pair are twisted with a second bit line of the second bit line pair between the first and second sides of a memory cell array without the first bit line of the first bit line pair and the first bit line of the second bit line pair crossing one another. According to embodiments of the invention, the first bit line of the first bit line pair and the second bit line of the second bit line pair run substantially in parallel across the memory cell array, and the second bit line of the second bit line pair crosses the first bit line of the first bit line pair and the first bit line of the second bit line pair at a central portion of the memory cell array. The second bit line may be constructed from three portions, including first and second straight portions which are joined by a third portion that crosses the first bit line of the first bit line pair and the second bit line of the second bit line pair. The first and second portions may be metal while the third portion may be a polycide (polysilicon/silicide) material.

According to one aspect of the present invention, an integrated circuit memory device includes a memory cell array and first and second sense amplifiers positioned on respective opposite first and second sides of the memory cell array. A first bit line pair and a second bit line pair connects the memory cell array to the first and second sense amplifiers, respectively. A first bit line of the first bit line pair and a first bit line of the second bit line pair extend across the memory cell array from the first side to the second side without crossing one another. A second bit line of the second bit line pair extends across the memory cell array from the first side to the second side, crossing the first bit line of the first bit line pair and the first bit line of the second bit line pair.

The second bit line of the second bit line pair may include a first portion positioned between the first bit line of the second bit line pair and the second bit line of the first bit line pair. A second portion is positioned on a side of the first bit line of the first bit line pair opposite the first bit line of the second bit line pair. A third portion interconnects the first and second portions and crosses the first bit line of the first bit line pair and the first bit line of the second bit line pair. The third portion may be formed from a different material than the first and second portions. For example, the third portion may be formed from a polycide material and the first and second portions may be formed from a metal.

According to another aspect of the present invention, an integrated circuit memory device includes a memory cell array, and first and second adjacent bit line pairs extending across the memory cell array, the first bit line pair including a first bit line and a first complementary bit line and the second bit line pair including a second bit line and a second complementary bit line. A first portion of the first bit line runs adjacent a first portion of the second bit line. A first portion of the first complementary bit line runs adjacent a first portion of the second complementary bit line. A second portion of the first bit line runs adjacent a second portion of the second complementary bit line. A second portion of the first complementary bit line runs adjacent a second portion of the second bit line. The second bit line preferably crosses the first and second complementary bit lines, more preferably at a central portion of the memory cell array, and the first and second complementary bit lines preferably extend across the memory cell array without crossing one another. An improved twisted bit line structure exhibiting desirable coupling capacitance characteristics may thereby be provided.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
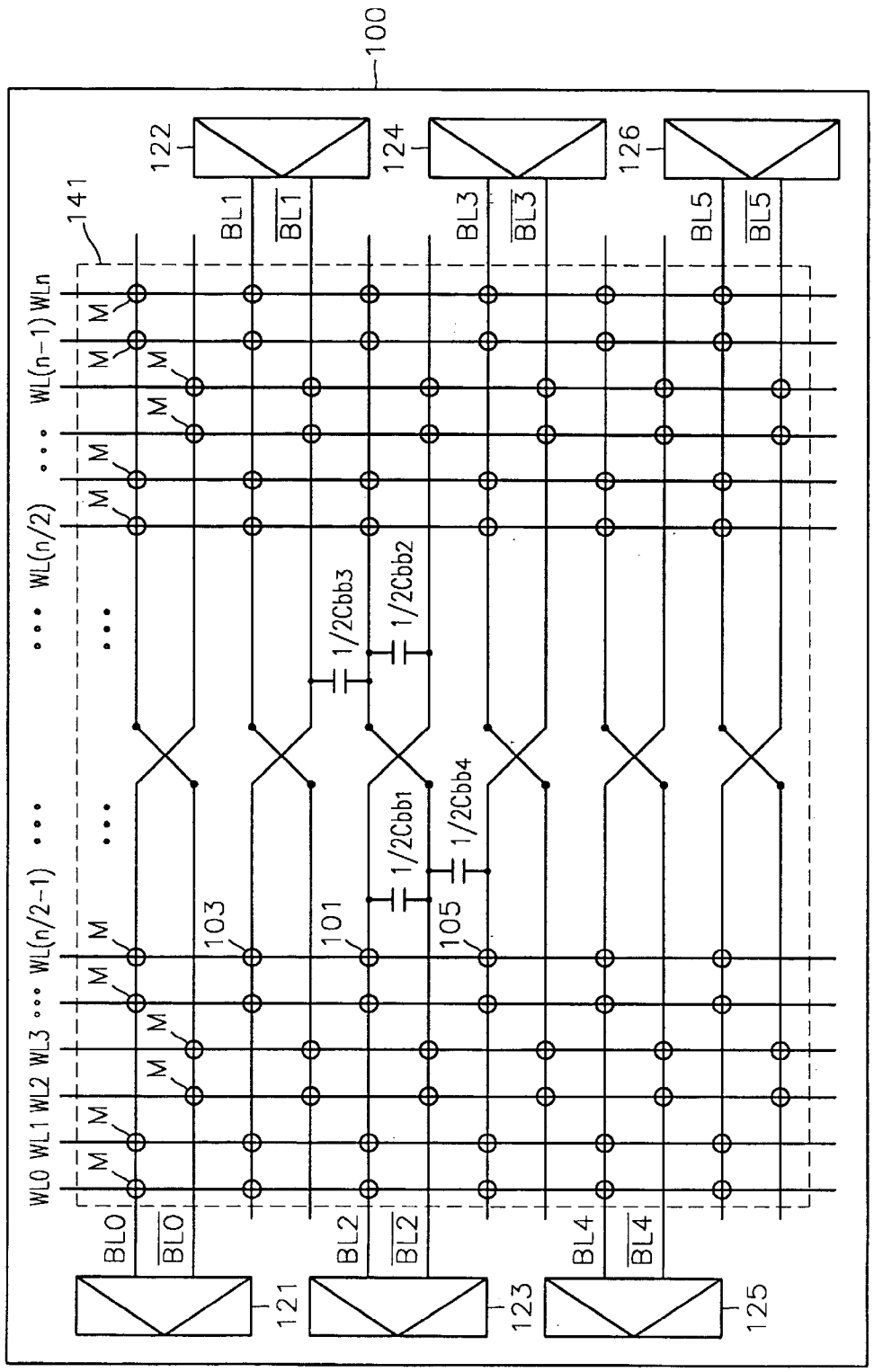
FIG. 1 is a schematic diagram illustrating a twisted bit line structure for a conventional memory device.
Figure 2:
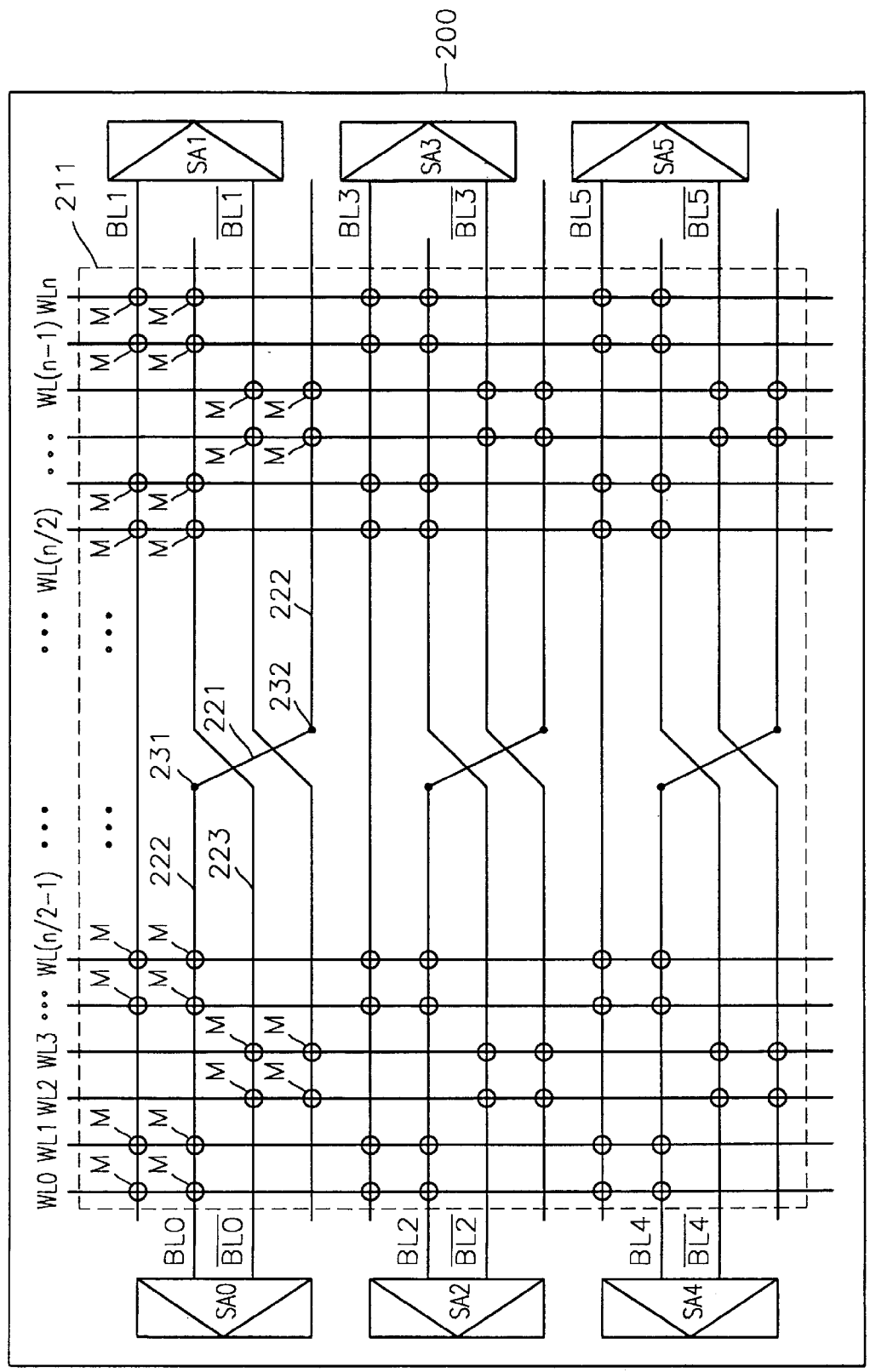
FIGS. 2 and 3 are schematic diagrams illustrating a memory device according to an embodiment of the present invention.

Referring to FIG. 2, a memory device 200 according to an embodiment of the present invention includes a plurality of bit line pairs (BL0, $\overline{BL0}$)–(BL5, $\overline{BL5}$), a plurality of wordlines WL0–WLn, a memory cell array 211, and a plurality of sense amplifiers SA0–SA5. The memory cell array 211 includes a plurality of memory cells M. The sense amplifiers SA0–SA5 are positioned on first and second sides of the memory cell array 211. The wordlines WL0–WLn cross the bit line pairs (BL0, $\overline{BL0}$)–(BL5, $\overline{BL5}$), and are insulated therefrom.

The memory cells M are selectively positioned at points where the bit line pairs (BL0, $\overline{BL0}$)–(BL5, $\overline{BL5}$) and the wordlines WL0–WLn cross. For a given one of the wordlines WL0–WLn, memory cells are formed at the intersections of the wordline with adjacent bit lines from respective first and second bit line pairs that are connected to respective opposing first and second sense amplifiers. The memory cells M may include, for example, a metal oxide semiconductor (MOS) transistor and a MOS storage capacitor. A respective one of the plurality of sense amplifiers SA0–SA5 is connected to a respective one of the bit line pairs (BL0, $\overline{BL0}$)–(BL5, $\overline{BL5}$).

Bit line pairs for opposing pairs of sense amplifiers are configured such that a first bit line of a first bit line pair and a first bit line of a second bit line pair are twisted together with a second bit line from the second bit line pair. For example, a first bit line $\overline{BL1}$ of the first bit line pair (BL1, $\overline{BL1}$) and a first bit line $\overline{BL0}$ of a second bit line pair (BL0, $\overline{BL0}$) are twisted with a second bit line BL0 of the second bit line pair (BL0, $\overline{BL0}$), the second bit line BL0 crossing the first bit line $\overline{BL1}$ of the first bit line pair (BL1, $\overline{BL1}$) and the first bit line $\overline{BL0}$ of the second bit line pair (BL0, $\overline{BL0}$) near a central portion of the memory cell array 211. The bit lines are configured such that the first bit line $\overline{BL1}$ of the first bit line pair (BL1, $\overline{BL1}$) and the first bit line $\overline{BL0}$ of the second bit line pair (BL0, $\overline{BL0}$) extend across the memory cell array 211 without crossing one another.

The second bit line BL0 of the second bit line pair (BL0, $\overline{BL0}$) includes first and second straight portions 222 interconnected by a third straight portion 221 that crosses the first bit line $\overline{BL1}$ of the first bit line pair (BL1, $\overline{BL1}$) and the first bit line $\overline{BL0}$ of the second bit line pair (BL0, $\overline{BL0}$) and is insulated therefrom. The first, second and third portions 222, 221 are connected at points 231, 232. The first and second portions 222 may be formed from a first conductive material, such as a metal, and the third portion 221 may be formed from a second conductive material, such as a polycrystalline silicon/silicide (polycide) material.

As can be seen in FIG. 2, for adjacent first and second bit line pairs (BL1, $\overline{BL1}$), (BL0, $\overline{BL0}$), a first portion of a bit line BL1 of the first bit line pair (BL1, $\overline{BL1}$) runs adjacent a first portion of a bit line BL0 of the second bit line pair (BL0, $\overline{BL0}$), and a second portion of the bit line BL1 of the first bit line pair (BL1, $\overline{BL1}$) runs adjacent a portion of the complementary bit line BL0 of the second bit line pair (BL0, $\overline{BL0}$). The complementary bit lines $\overline{BL1}$, $\overline{BL0}$ run adjacent one another in a substantially parallel fashion, and are shifted laterally at a central portion of the memory cell array 211, in the area where the bit line BL0 crosses them.

As can be seen from FIG. 2, a similar configuration is applied the other bit line pairs (BL2, $\overline{BL2}$), (BL3, $\overline{BL3}$), (BL4, $\overline{BL4}$), (BL5, $\overline{BL5}$). It will be understood that the complementary bit lines ($\overline{BL0}$, $\overline{BL1}$, $\overline{BL2}$, $\overline{BL3}$, $\overline{BL4}$, $\overline{BL5}$) may each be bent at two portions or more, according to the manner of design. As described above, one bit line among two adjacent bit line pairs is twisted with two complementary bit lines of the adjacent pair, facilitating formation of twisted bit line pairs.

Figure 3:
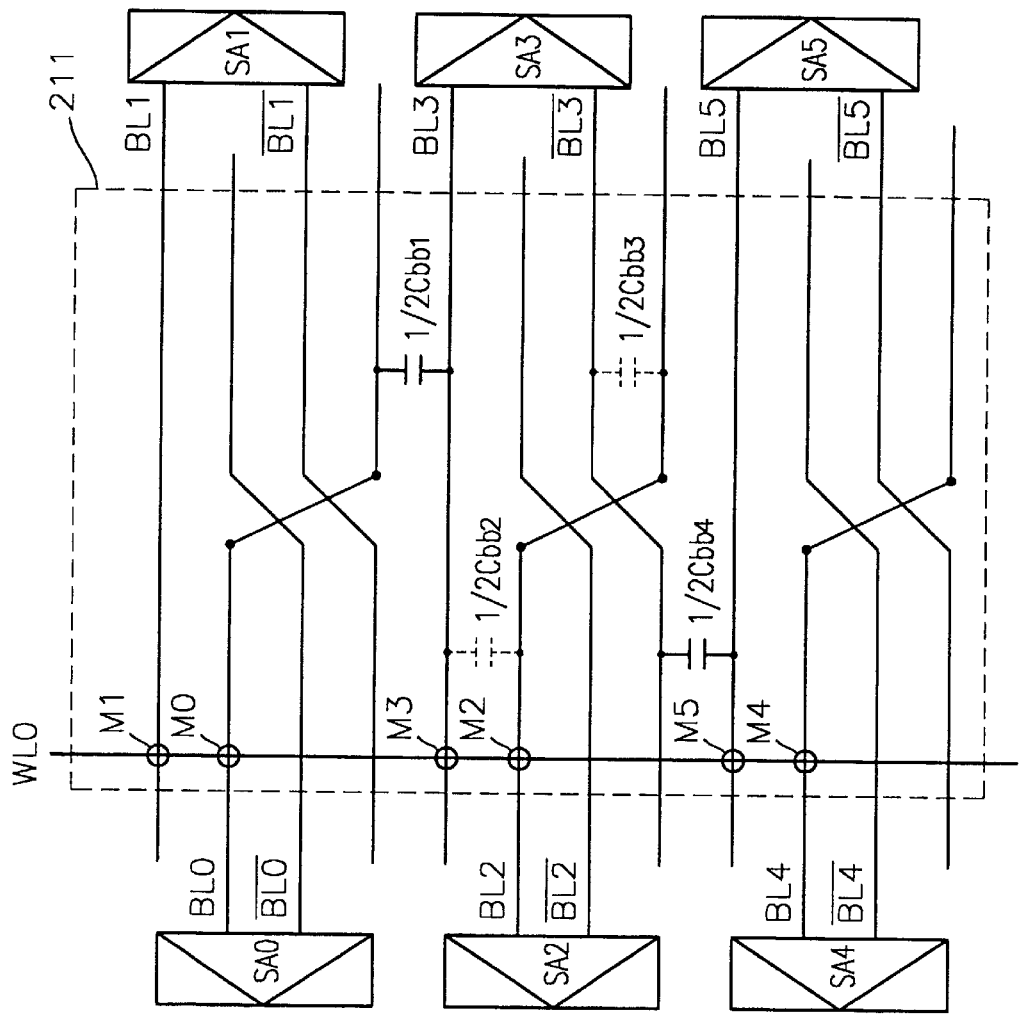

FIG. 3 is a schematic diagram which aids in illustrating coupling capacitance generated in a bit line BL2 of the bit line pair (BL2, $\overline{BL2}$). Coupling capacitance is present in the bit line pair (BL3, $\overline{BL3}$) when the cell M3 is selected from among the memory cells M0–M5. This coupling capacitance can arise from the bit line BL3 or the complementary bit line $\overline{BL3}$.

Coupling capacitances for the bit line BL3 include a coupling capacitance ½Cbb1 due to the bit line BL0 connected to the cell M0 and a coupling capacitance ½Cbb2 due to the bit line BL2 connected to the cell M2. Coupling capacitances for the complementary bit line $\overline{BL3}$ include a coupling capacitance ½Cbb3 due to the bit line BL2 connected to the cell M2 and a coupling capacitance ½Cbb4 due to the bit line BL5 connected to the cell M5.

The coupling capacitances ½Cbb2 and ½Cbb3 are of approximately equal magnitude, and due to the configuration of the bit lines, offset one another. Consequently, these capacitances can be ignored for purposes of determining coupling capacitance present when the cell M3 is selected. Thus, when the cell M3 is selected and data stored in the cell M3 is detected by the sense amplifier SA3, the predominant coupling capacitances which affect the operation are the coupling capacitance ½Cbb1 due to the bit line BL0 connected to the cell M0 and the coupling capacitance ½Cbb4 due to the bit line BL5 connected to the cell M5, and the total coupling capacitance Cbbt of the bit line BL3 connected to the cell M3 may be expressed as:

$$Cbbt = \frac{1}{2}Cbb1 + \frac{1}{2}Cbb4. \tag{3}$$

Because Cbb1 and Cbb4 are approximately equal to a nominal coupling capacitance Cbb, the total coupling capacitance Cbbt may thus be expressed as:

$$Cbbt = Cbb. \tag{4}$$

Figure 4:
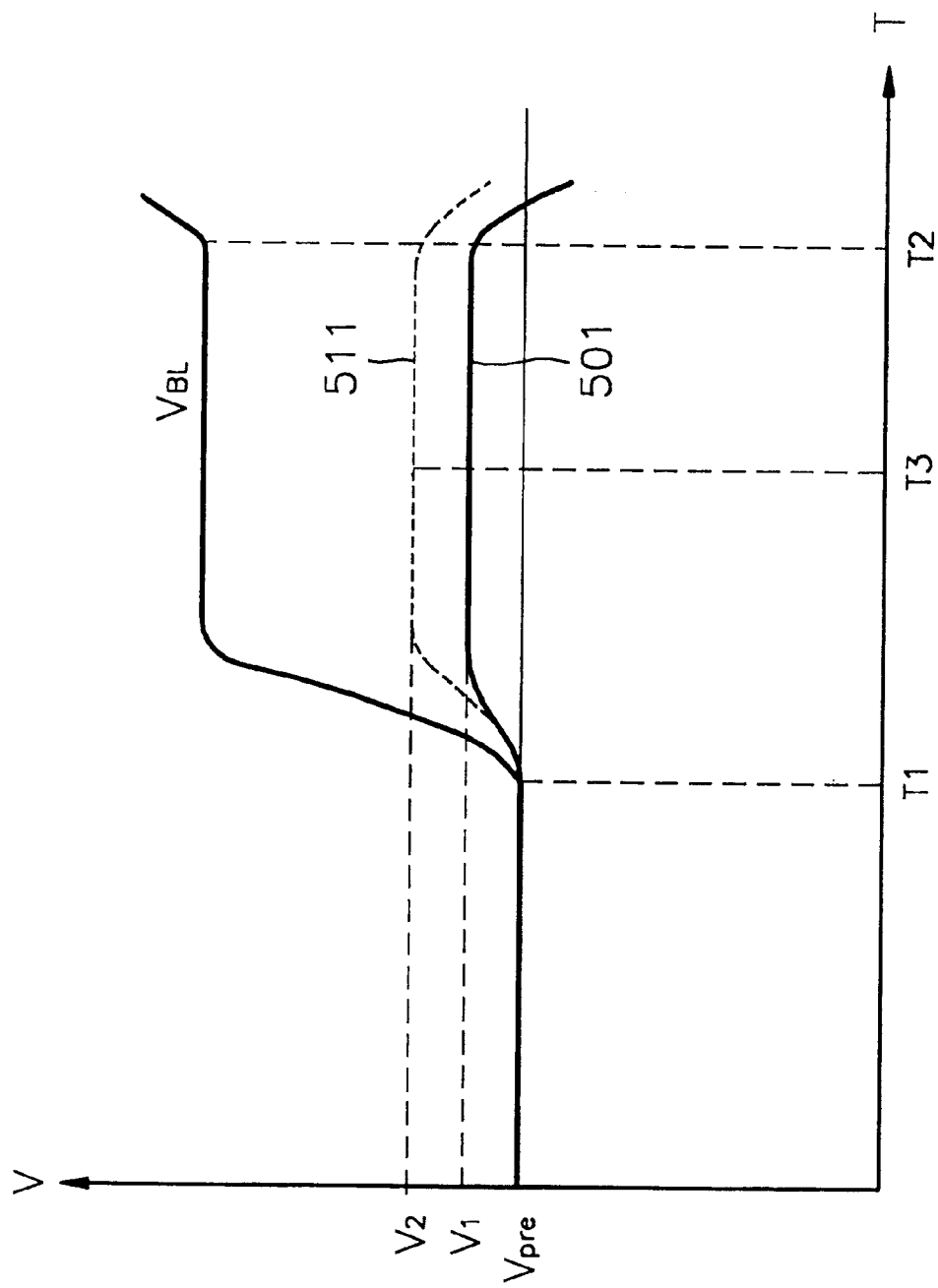
FIG. 4 is a graph comparing a bit line voltage waveform for a conventional memory device to a bit line voltage waveforms for a memory device according to an embodiment of the present invention.

FIG. 4 is a graph that compares bit line voltages for a conventional bit line structure to bit line voltages for the twisted bit line structure of FIGS. 2 and 3, in particular bit line voltages for the bit line pair (BL3, $\overline{BL3}$). Assuming that a logic '1' is stored in the memory cell M3, when the wordline WL0 is activated, the voltage $V_{BL}$ of the bit line BL3 increases due to a charge sharing with the memory cell M3. For the bit line structure of FIGS. 2 and 3, voltage 501 of the complementary bit line $\overline{BL3}$ increases to a level $V_1$ greater than a precharge voltage $V_{pre}$. As illustrated, the level $V_1$ is less than (approximately half) the level $V_2$ for a corresponding complementary bit line voltage 511 for the conventional device. Comparison of the two voltage waveforms 501, 511 illustrates the reduction in crosstalk arising from the reduced coupling capacitance provided according to embodiments of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a memory cell array;
   first and second sense amplifiers positioned on respective opposite first and second sides of said memory cell array; and
   a first bit line pair and a second bit line pair connecting said memory cell array to said first and second sense amplifiers, respectively, wherein a first bit line of said first bit line pair and a first bit line of said second bit line pair extend across said memory cell array from said first side to said second side without crossing one another, and wherein a second bit line of said second bit line pair extends across said memory cell array from said first side to said second side, crossing said first bit line of said first bit line pair and said first bit line of said second bit line pair.

2. An integrated circuit memory device according to claim 1, wherein said second bit line of said second bit line pair comprises:
   a first portion positioned between said first bit line of said second bit line pair and said second bit line of said first bit line pair;
   a second portion positioned on a side of said first bit line of said first bit line pair opposite said first bit line of said second bit line pair; and
   a third portion interconnecting said first and second portions and crossing said first bit line of said first bit line pair and said first bit line of said second bit line pair.

3. An integrated circuit memory device according to claim 2, wherein said third portion is formed from a different material than said first and second portions.

4. An integrated circuit memory device according to claim 3, wherein said third portion is formed from a polycide material and wherein said first and second portions are formed from a metal.

5. An integrated circuit memory device according to claim 2, wherein said first, second and third portions are substantially straight.

6. An integrated circuit memory device according to claim 2, wherein said second bit line of said second bit line pair crosses said first bit line of said first bit line pair and said first bit line of said second bit line pair near a central portion of said memory cell array.

7. An integrated circuit memory device according to claim 6, wherein said first bit line of said first bit line pair and said first bit line of said second bit line pair are laterally shifted at said location where said second bit line of said second bit line pair crosses said first bit line of said first bit line pair and said first bit line of said second bit line pair.

8. An integrated circuit memory device according to claim 2:
   wherein said second bit line of said first bit line pair extends substantially straight across said memory cell array;
   wherein said first portion of said second bit line of said second bit line pair runs adjacent said second bit line of said first bit line pair across a first portion of said memory cell array;
   wherein said first bit line of said second bit line pair includes:
      a first portion running adjacent said first portion of said second bit line of said second bit line pair over said first portion of said memory cell array; and
      a second portion running adjacent said second bit line of said first bit line pair over a second portion of said memory cell array;
   wherein said first bit line of said first bit line pair includes:
      a first portion running adjacent said first portion of said first bit line of said second bit line pair over said first portion of said memory cell array; and
      a second portion running adjacent said second portion of said first bit line of said second bit line pair over said second portion of said memory cell array; and
   wherein said second portion of said second bit line of said second bit line pair runs adjacent said second portion of said first bit line of said second bit line pair over said second portion of said memory cell array.

9. An integrated circuit memory device according to claim 1, wherein said first bit line of said first bit line pair and said first bit line of said second bit line pair extend across said memory cell array in a substantially parallel fashion.

10. An integrated circuit memory device, comprising:
    a memory cell array;
    first and second adjacent bit line pairs extending across said memory cell array, said first bit line pair including a first bit line and a first complementary bit line and said second bit line pair including a second bit line and a second complementary bit line, wherein:
       a first portion of said first bit line runs adjacent a first portion of said second bit line;
       a first portion of said first complementary bit line runs adjacent a first portion of said second complementary bit line;
       a second portion of said first bit line runs adjacent a second portion of said second complementary bit line; and
       a second portion of said first complementary bit line runs adjacent a second portion of said second bit line.

11. An integrated circuit memory device according to claim 10, wherein said second bit line crosses said first and second complementary bit lines.

12. An integrated circuit memory device according to claim 11, wherein said second bit line crosses said first and second complementary bit lines at a central portion of said memory cell array.

13. An integrated circuit memory device according to claim 11, wherein said first and second complementary bit lines extend across said memory cell array without crossing one another.

14. An integrated circuit memory device according to claim 13, wherein said first and second complementary bit lines extend across said memory cell array in a substantially parallel fashion.

15. An integrated circuit memory device according to claim 10, wherein said second bit line comprises:
- a first portion positioned between said first bit line and said second complementary bit line;
- a second portion positioned on a side of said first complementary bit line opposite said second complementary bit line; and
- a third portion interconnecting said first and second portions and crossing said first and second complementary bit lines.

16. An integrated circuit memory device according to claim 15, wherein said third portion is formed from a different material than said first and second portions.

17. An integrated circuit memory device according to claim 16, wherein said third portion is formed from a polycide material and wherein said first and second portions are formed from a metal.

18. An integrated circuit memory device according to claim 10, further comprising respective first and second sense amplifiers positioned on respective first and second sides of said memory cell array and connected to respective ones of said first and second bit line pairs.

* * * * *